United States Patent
Jeong

(10) Patent No.: US 9,349,487 B2
(45) Date of Patent: May 24, 2016

(54) ELECTRONIC DEVICE

(71) Applicant: SK hynix Inc., Icheon-Si (KR)

(72) Inventor: Hoe-Gwon Jeong, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 14/867,808

(22) Filed: Sep. 28, 2015

(65) Prior Publication Data

US 2016/0019980 A1 Jan. 21, 2016

Related U.S. Application Data

(63) Continuation of application No. 14/191,409, filed on Feb. 26, 2014, now Pat. No. 9,147,467.

(30) Foreign Application Priority Data

Feb. 28, 2013 (KR) .................. 10-2013-0022220

(51) Int. Cl.
*G11C 13/00* (2006.01)
*G11C 29/12* (2006.01)
*G11C 11/56* (2006.01)

(52) U.S. Cl.
CPC ............ *G11C 29/12* (2013.01); *G11C 11/5607* (2013.01); *G11C 11/5678* (2013.01); *G11C 11/5685* (2013.01); *G11C 13/004* (2013.01); *G11C 13/0069* (2013.01)

(58) Field of Classification Search
CPC ............... G11C 11/16; G11C 11/5607; G11C 11/5678; G11C 13/004; G11C 13/002; G11C 13/0004

USPC ......................... 365/148, 158, 189.17, 230.06
See application file for complete search history.

(56) References Cited

U.S. PATENT DOCUMENTS

| 5,623,644 | A | 4/1997 | Self et al. |
| 8,102,018 | B2 | 1/2012 | Bertin et al. |
| 8,363,457 | B2 | 1/2013 | Keshtbod |
| 9,147,467 | B2 * | 9/2015 | Jeong ................. G11C 11/5607 |

FOREIGN PATENT DOCUMENTS

| KP | 10-2008-0011805 | 2/2008 |
| KR | 10-2005-0067813 | 7/2005 |
| KR | 10-2009-0121181 | 11/2009 |

* cited by examiner

*Primary Examiner* — Gene Auduong
(74) *Attorney, Agent, or Firm* — Perkins Coie LLP

(57) ABSTRACT

An electronic device comprising a semiconductor memory unit that may include a variable resistance element configured to be changed in a resistance value thereof in response to current flowing through both ends thereof, a toggle data generation unit configured to generate toggle data of which logic value toggles with a predetermined cycle, in a first mode for testing reliability of the variable resistance element, a data transfer line configured to transfer data inputted from an outside, and a driving unit configured to flow current which is changed in its direction with the predetermined cycle, through the variable resistance element in response to the toggle data in the first mode, and flow current through the variable resistance element in a direction determined in response to the data of the data transfer line, in a second mode in writing date into or reading data from the variable resistance element.

5 Claims, 9 Drawing Sheets

ELECTRONIC DEVICE

CROSS-REFERENCE TO RELATED APPLICATIONS

The present application is a continuation of, and claims priority and benefits of, U.S. patent application Ser. No. 14/191,409, published as US 2014/0241040, entitled "ELECTRONIC DEVICE," and filed on Feb. 26, 2014, which further claims priority of Korean Patent Application No. 10-2013-0022220, entitled "SEMICONDUCTOR DEVICE, PROCESSOR, SYSTEM AND TEST SYSTEM INCLUDING THE SAME," and filed on Feb. 28, 2013. The contents of the before-mentioned patent applications (including US 2014/0241040) are incorporated herein by reference in their entirety as part of the disclosure of this document.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development of such semiconductor devices has been conducted. Examples of such semiconductor devices include semiconductor devices which can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which use data internally generated when performing a test for applying a stress to a variable resistance element, to allow a number of electronic devices to be tested at a time, thereby shortening a test time and reducing a test cost. Implementations of the disclosed technology can be used for applications involving a processor, a system and an electronic device.

In one aspect, an electronic device is provided to include a semiconductor memory unit. The semiconductor memory unit may include: a variable resistance element configured to be changed in a resistance value thereof in response to current flowing through both ends thereof; a toggle data generation unit configured to generate toggle data of which logic value toggles with a predetermined cycle, in a first mode; a data transfer line configured to transfer data inputted from an outside; and a driving unit configured to flow current which is changed in its direction with the predetermined cycle, through the variable resistance element in response to the toggle data in the first mode, and flow current through the variable resistance element in a direction determined in response to the data of the data transfer line, in a second mode.

In another aspect, an electronic device comprising a semiconductor memory unit is provided to include: a variable resistance element configured to be changed in a resistance value thereof in response to current flowing through both ends thereof; a toggle data generation unit configured to generate toggle data of which logic value toggles with a predetermined cycle, in a first mode; a data transfer line configured to transfer data inputted from a data source outside the semiconductor memory unit; and a driving unit coupled to the variable resistance element and the toggle data generation unit, the driving unit configured to direct a current which is changed in its direction with the predetermined cycle, through the variable resistance element in response to the toggle data in the first mode to test a reliability of the variable resistance element, and to direct another current through the variable resistance element in a direction determined in response to the data of the data transfer line, in a second mode for operating the variable resistance element in a write or read operation.

In some implementations, the variable resistance element possesses a first state with a first resistance value or a second state with a second resistance value larger than the first resistance value.

In some implementations, in the first mode, the driving unit flows current in a first direction through the variable resistance element when the toggle data is first data and flows current in a second direction through the variable resistance element when the toggle data is second data.

In some implementations, in the second mode, the driving unit flows current in the first direction through the variable resistance element when the data of the data transfer line is the first data and flows current in the second direction through the variable resistance element when the data of the data transfer line is the second data.

In some implementations, the toggle data generation unit controls the predetermined cycle with which the logic value of the toggle data toggles, in response to cycle select information in the first mode.

In some implementations, the toggle data generation unit generates the toggle data using a data clock with a basic cycle and at least one divided data clock which is generated by dividing the data clock with a predetermined division ratio, and transfers a clock selected by the cycle select information between the data clock and the at least one divided data clock, as the toggle data.

In some implementations, the toggle data generation unit deactivates the toggle data in the second mode.

In some implementations, when an operation in the first mode is completed, the resistance value of the variable resistance element is changed in response to the data of the data transfer line in the second mode, and whether the variable resistance element is failed or not is detected by discriminating the resistance value of the variable resistance element.

In some implementations, the variable resistance element includes a metal oxide or a phase change substance.

In another aspect, an electronic device comprising a semiconductor memory unit is provided to include: a plurality of variable resistance elements configured to be determined in resistance values thereof according to values of data stored therein; a toggle data generation unit configured to generate toggle data of which logic value toggles with a predetermined cycle, in a first mode; a data transfer line configured to transfer data inputted from an outside; and an access control unit configured to flow current which is changed in its direction with the predetermined cycle, through a variable resistance element selected among the plurality of variable resistance elements, in response to the toggle data in the first mode, and flow current through a variable resistance element selected among the plurality of variable resistance elements, in a direction determined in response to the data of the data transfer line, in a second mode.

In another aspect, an electronic device comprising a semiconductor memory unit is provided to include: a plurality of variable resistance elements configured to be determined in resistance values thereof according to values of data stored therein; a toggle data generation unit configured to generate toggle data of which logic value toggles with a predetermined cycle, in a first mode; a data transfer line configured to transfer data inputted from an outside; and an access control unit configured to flow current which is changed in its direction with the predetermined cycle, through a variable resistance element selected among the plurality of variable resistance elements, in response to the toggle data in the first mode, and flow current through a variable resistance element selected among the plurality of variable resistance elements, in a direction determined in response to the data of the data transfer line, in a second mode.

In another aspect, an electronic device comprising a semiconductor memory unit is provided to include: a plurality of variable resistance elements each configured to exhibit variable resistance values for storing data; a toggle data generation unit configured to generate toggle data of which logic value toggles with a predetermined cycle, in a first mode in testing a reliability of each of the variable resistance elements; a data transfer line configured to transfer data inputted into the semiconductor memory unit; and an access control unit coupling the toggle data generation unit and the data transfer line to the variable resistance elements and configured to flow a current which is changed in its direction with the predetermined cycle, through a variable resistance element selected among the plurality of variable resistance elements, in response to the toggle data in the first mode in testing a reliability of the selected variable resistance element, and to direct another current through a variable resistance element selected among the plurality of variable resistance elements, in a direction determined in response to the data of the data transfer line, in a second mode in reading data from or writing data into the selected variable resistance element.

In another aspect, an electronic device is provided to include: a semiconductor memory unit including at least one data pad, a plurality of variable resistance elements which are determined in resistance values thereof according to values of data stored therein, and a toggle data generation unit which generates toggle data with a logic value toggling with a predetermined cycle in a first mode, and configured to flow current which is changed in its direction with the predetermined cycle, through a variable resistance element selected among the plurality of variable resistance elements in response to the toggle data in the first mode and flow current through a variable resistance element selected among the plurality of variable resistance elements in a direction determined in response to data inputted through the at least one data pad in a second mode; and test device configured to input at least one command signal to allow the semiconductor memory unit to operate in one of the first mode and the second mode, and input data to be written in the semiconductor memory unit, through the at least one data pad, or receive data outputted from the semiconductor memory unit, in the case where the semiconductor memory unit operates in the second mode.

In some implementations, the test device inputs at least one command signal which allows the semiconductor memory unit to operate in the first mode, and inputs at least one command signal which allows the semiconductor memory unit to operate in the second mode when an operation of the semiconductor memory unit in the first mode is completed, and inputs data to be written in the plurality of variable resistance elements, through the at least one data pad in the second mode, and reads data of the plurality of variable resistance elements through the at least one data pad, and detects a failed variable resistance element among the plurality of variable resistance elements by using the read data.

In some implementations, the variable resistance element possesses a first state with a first resistance value or a second state with a second resistance value larger than the first resistance value.

In some implementations, in the first mode, the access control unit flows current in a first direction through the variable resistance element when the toggle data is first data and flows current in a second direction through the variable resistance element when the toggle data is second data.

In some implementations, in the second mode, the access control unit flows current in the first direction through the variable resistance element when the data of the data transfer line is the first data and flows current in the second direction through the variable resistance element when the data of the data transfer line is the second data.

In some implementations, the toggle data generation unit controls the predetermined cycle with which the logic value of the toggle data toggles, in response to cycle select information in the first mode.

In some implementations, the toggle data generation unit deactivates the toggle data in the second mode.

In some implementations, the access control unit flows current with a predetermined current amount, through the variable resistance element, in the second mode and in a read operation.

In some implementations, when an operation in the first mode is completed, data are stored in the plurality of variable resistance elements by performing the write operation in the second mode, and a variable resistance element with a fail is detected through discriminating data stored in the plurality of variable resistance elements by performing the read operation.

In some implementations, the plurality of variable resistance elements includes at least one among a metal oxide, a phase change substance and a structure in which a tunnel barrier layer is interposed between two ferromagnetic layers.

In some implementations, the semiconductor device deactivates the toggle data in the second mode.

In some implementations, the variable resistance element may include a metal oxide or a phase change substance and a tunnel barrier layer is interposed between two ferromagnetic layers.

In some implementations, the electronic device may further include a microprocessor which includes: a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

In yet another aspect, a method for operating a test device to test one or more semiconductor devices each including variable resistance elements for storing data is provided. The method may include: connecting one or more semiconductor devices under test to a test device, wherein each semiconductor device includes one data pad, a plurality of variable resistance elements which are determined in resistance values thereof according to values of data stored therein, and a toggle data generation unit which generates toggle data with a logic value toggling with a predetermined cycle in a first mode for testing reliability of the variable resistance elements, and configured to flow a current which is changed in its direction with the predetermined cycle, through a variable resistance element selected among the plurality of variable resistance elements in response to the toggle data in the first mode and flow another current through a variable resistance element selected among the plurality of variable resistance elements in a direction determined in response to data inputted through the one data pad in a second mode for writing data into or reading data from the selected variable resistance value; operating the test device to input a command signal to set a semiconductor device under test to operate in the first mode to test reliability of the variable resistance elements of the semiconductor device; and operating the test device to input another command signal to set and the semiconductor device under test to operate in the second mode to write input data from the one data pad in the semiconductor device, or to read input data from the semiconductor device.

In some implementations, each of the variable resistance elements has a first resistance value in the case where first data is stored therein and a second resistance value larger than the first resistance value in the case where second data is stored therein.

In some implementations, the method may include: in the first mode, operating the semiconductor device to direct a current in a first direction through the variable resistance element when the toggle data is first data and direct a current in a second direction through the variable resistance element when the toggle data is second data, and in the second mode and in a write operation, operating the semiconductor device to direct a write current in the first direction through the variable resistance element when the data of a data transfer line is the first data and to direct a write current in the second direction through the variable resistance element when the data of the data transfer line is the second data.

In some implementations, the method may include: operating the semiconductor device to deactivate the toggle data in the second mode.

In some implementations, the method may include: operating the test device to operate the semiconductor device under test in the second mode after completing an operation of the semiconductor device in the first mode; while in the second mode, using the one data pad to input data to be written in the plurality of variable resistance elements of the semiconductor device under test and subsequently reading data of the plurality of variable resistance elements through the one data pad; and detecting whether there is a failed variable resistance element among the plurality of variable resistance elements by using the read data.

In some implementations, the method may further include: operating the test device to simultaneously test two or more semiconductor devices.

Those and other aspects of the disclosed technology and their implementations and variations are described in greater detail in the drawings, the description and the claims.

DETAILED DESCRIPTION

Various examples and implementations of the disclosed technology are described below in detail with reference to the accompanying drawings.

A semiconductor device implementing memory circuitry based on the disclosed technology may include a variable resistance element. In the following examples, a variable resistance element can exhibit a variable resistance characteristic and may include a single layer or a multi-layer. For example, a variable resistance element may include substances used in an RRAM, a PRAM, an MRAM, an FRAM, etc. and such a substance may include, for example, a chalcogenide-based compound, a transition metal compound, a ferroelectric, a ferromagnetic, and so on. A suitable substance for implementing the disclosed technology is not limited to these listed substances and can be a substance or material as a part of a variable resistance element exhibiting a variable resistance characteristic to switch between different resistance states in response to a voltage or current applied to both ends thereof.

In some implementations, a variable resistance element may include a metal oxide. For example, the metal oxide may be a transition metal oxide such as a nickel (Ni) oxide, a titanium (Ti) oxide, a hafnium (Hf) oxide, a zirconium (Zr) oxide, a tungsten (W) oxide and a cobalt (Co) oxide or a perovskite-based substance such as STO (SrTiO) and PCMO (PrCaMnO). Such a variable resistance element can be switched between different resistance states due to creation and extinction of current filaments through behavior of vacancies.

In other implementations, a variable resistance element may include a phase change substance. For example, the phase change substance may be a chalcogenide-based substance such as GST (Ge—Sb—Te). This variable resistance element can be switched between different resistance states by being stabilized in a crystalline state and an amorphous state by heat.

In yet other implementations, a variable resistance element may include a structure in which a tunneling barrier layer is interposed between two ferromagnetic layers. The ferromagnetic layers may be formed using a substance such as NiFeCo and CoFe, and the tunneling barrier layer may be formed using a substance such as Al2O3. The variable resistance element can be switched between different resistance states based on magnetization directions of the ferromagnetic layers. For example, in the case where the magnetization directions of the two ferromagnetic layers are parallel to each other, the variable resistance element may be in a low resistance state, and, in the case where the magnetization directions of the two ferromagnetic layers are not parallel to each other, the variable resistance element may be in a high resistance state.

Figure 1:
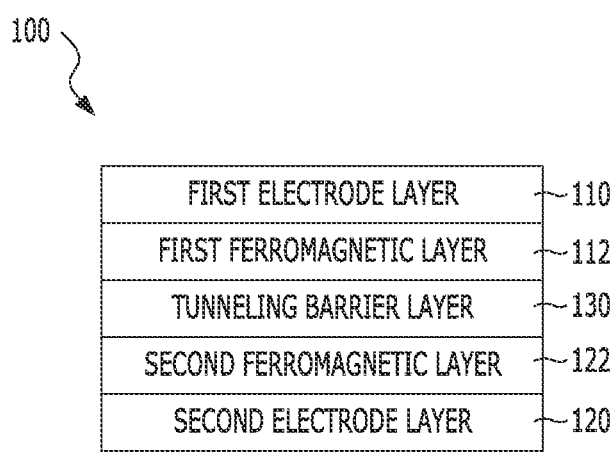
FIG. 1 is a diagram showing an example of a magnetic tunnel junction (MTJ) element as one of structures in which a tunneling barrier layer is interposed between two ferromagnetic layers.

FIG. 1 is a diagram showing an example of a magnetic tunnel junction (MTJ) element as part of a variable resistance element in which a tunneling barrier layer is interposed between two ferromagnetic layers.

Referring to FIG. 1, an MTJ element 100 includes a first electrode layer 110 as a top electrode, a second electrode layer 120 as a bottom electrode, a first ferromagnetic layer 112 and a second ferromagnetic layer 122 as a pair of ferromagnetic layers, and a tunneling barrier layer 130 which is formed between the pair of ferromagnetic layers 112 and 122.

The first ferromagnetic layer 112 is a free ferromagnetic layer of which magnetization direction may be changed according to a direction of a current applied to the MTJ element 100, and the second ferromagnetic layer 122 is a pinned ferromagnetic layer of which magnetization direction is pinned at a fixed magnetization direction.

The MTJ element 100 can change its resistance value based on a direction of an applied current, and records data "0" or "1" corresponding to a particular resistance value between two resistance values such as a high resistance value and a low resistance value.

Figure 2A:
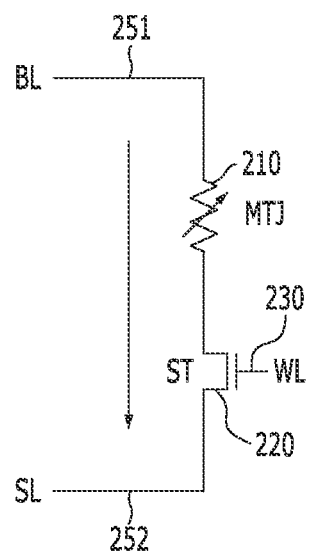
FIGS. 2A and 2B are views explaining a principle of storing data in a variable resistance element.
Figure 2B:
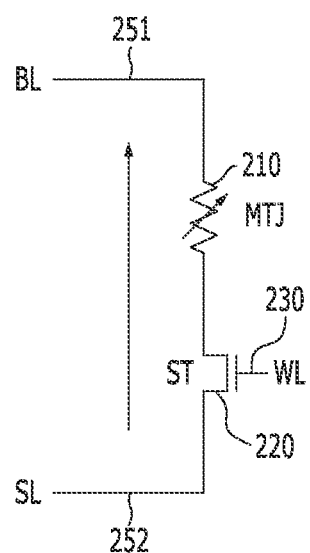

FIGS. 2A and 2B show operations of an example memory circuit having a variable resistance element 210 to explain a principle of storing data in the variable resistance element. The variable resistance element 210 (R) may be, for example, the MTJ element 100 described above with reference to FIG. 1. The memory circuit includes a select transistor 220 (ST) having a terminal 230 in form of a word line (WL) and the variable resistance element 210 connected in series between two terminals represented by a bit line (BL) 251 and a source line (SL) 252 as a 3-terminal circuit. The select transistor 220 (ST) is provided to select or de-select the variable resistance element 210.

FIG. 2A is a diagram explaining a principle of recording data with a low logic value in the variable resistance element 210 (R). To select the variable resistance element 210 (R) in which data is to be stored, the word line WL 230 for the variable resistance element 210 (R) is activated to turn on the select transistor 220 (ST) for selecting the element 210. As the current flows from one end, BL 251, to the other end, SL 252, in the direction indicated by the arrow, that is, from the first electrode layer 110 as a top electrode to the second electrode layer 120 as a bottom electrode in the MTJ element 100 shown in FIG. 1, the magnetization direction of the first ferromagnetic layer 112 as a free ferromagnetic layer and the magnetization direction of the second ferromagnetic layer 122 as a pinned ferromagnetic layer become parallel to each other, and the variable resistance element 210 (R) is in a low resistance state. When the variable resistance element 210 (R) is in the low resistance state, a "low" data is stored in the variable resistance element 210 (R).

Next, FIG. 2B is a diagram explaining a principle of recording data with a high logic value in the variable resistance element 210 (R). In a similar manner, the word line WL 230 connected to the variable resistance element 210 (R) is activated to turn on the select transistor 220 (ST). As the current flows from the other end, SL 252, to the end, BL 251, in the direction indicated by the arrow in an opposite direction of the current flow in FIG. 2A, that is, from the second electrode layer 120 to the first electrode layer 110 in the MTJ element 100 shown in FIG. 1, the magnetization direction of the first ferromagnetic layer 112 and the magnetization direction of the second ferromagnetic layer 122 become antiparallel to each other, and the variable resistance element 210

(R) is in a high resistance state. When the variable resistance element 210 (R) is in the high resistance state, a "high" data is stored in the variable resistance element 210 (R).

In order for a semiconductor device including a variable resistance element to operate properly, the resistance of the variable resistance element in which data is to be written should be switched when a predetermined write current flows through, and the resistance of the variable resistance element from which data is to be read should not be switched when a predetermined read current flows through. Also, the variable resistance element should maintain its properties (such as the magnetization direction of the free layer 112) against a stress which is applied from an outside. In order to evaluate the reliability of the variable resistance element against a stress during fabricating a semiconductor device, a stress test is performed on each variable resistance element by applying a stress to the variable resistance element and this stress test is used to predict whether the variable resistance element may be reliable for use without a failure under an applied stress.

Such a stress test may be performed by using a test device having test pads that are coupled to a semiconductor device under test and different test pads are allocated to different semiconductor devices under test. During the stress test, data having toggling logic values is inputted through a data pad of the semiconductor device for a predetermined time and a predetermined current which is changed in its direction with a predetermined cycle is directed to flow through the variable resistance element according to the inputted data. However, the number of test pads of a test device is limited, and some of the pads of the test device should be allocated for each semiconductor device to input data for the stress test to each semiconductor device. Therefore, the number of semiconductor devices that can be tested at a time is limited. This limitation causes an increase of a test time spent on the test and causes an increase of cost incurred for the test.

Figure 3:
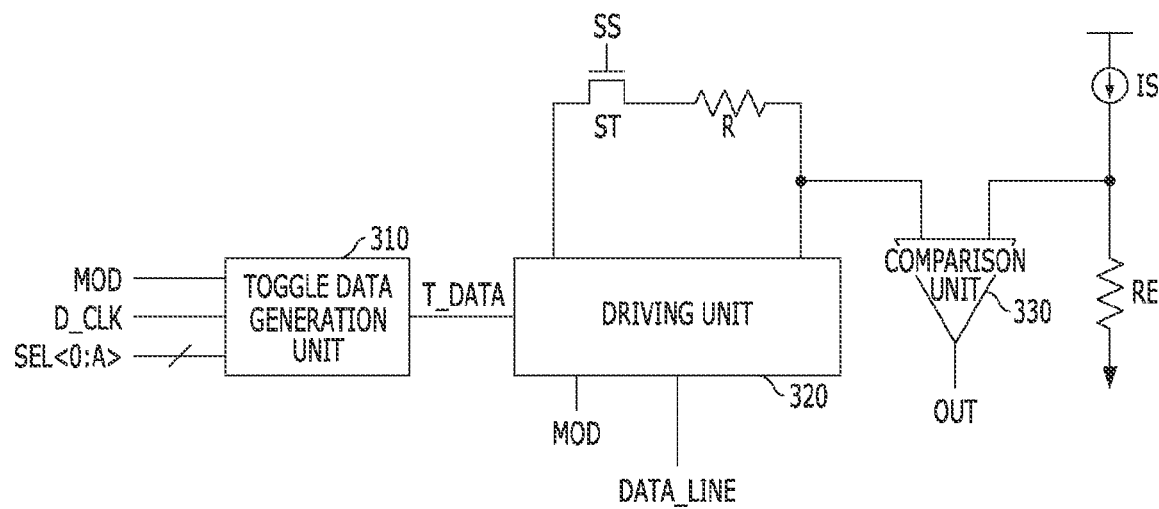
FIG. 3 is an example of a configuration diagram of a memory circuit or device including a variable resistance element.
Figure 4:
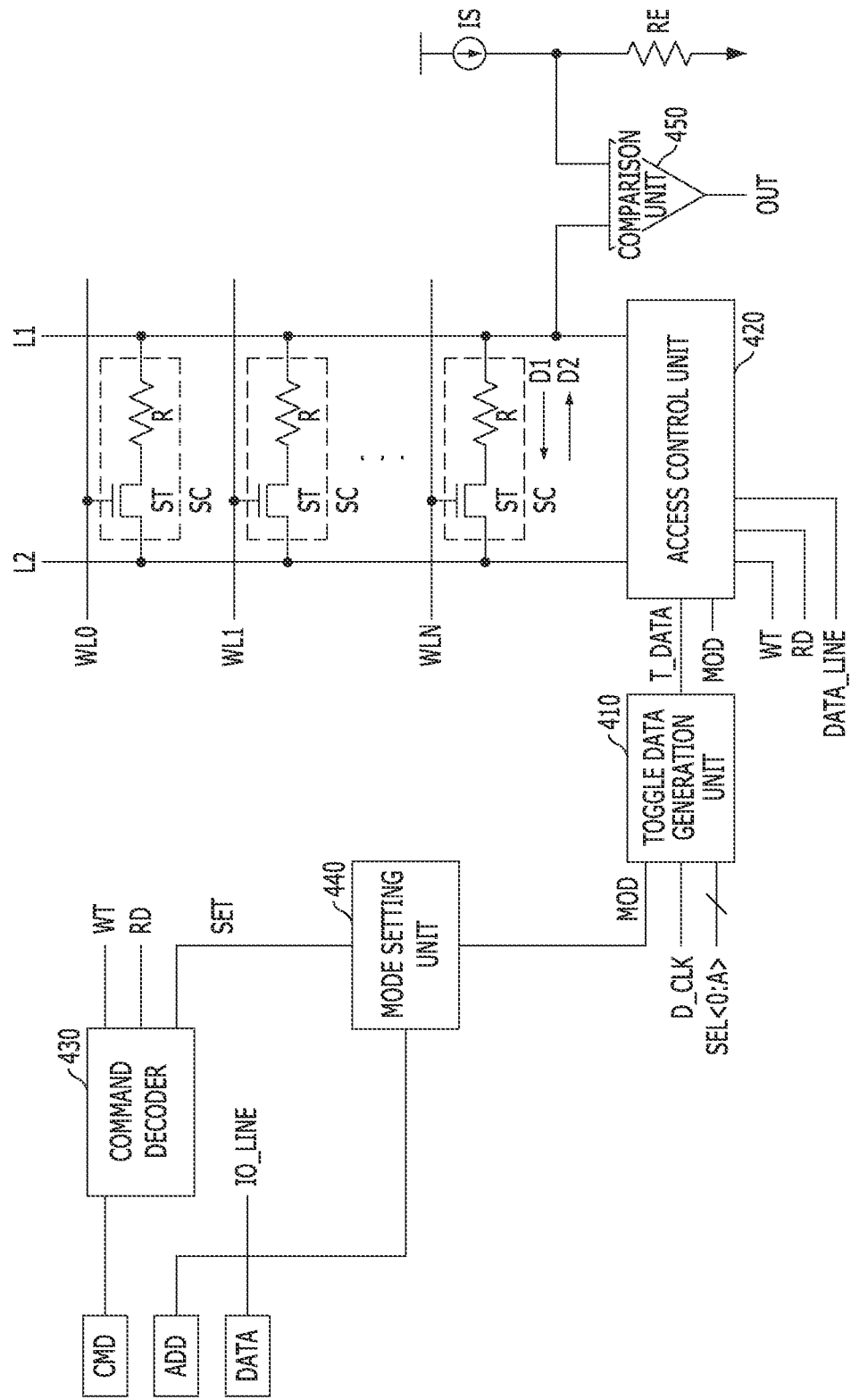
FIG. 4 is an example of a configuration diagram of a memory circuit or device including a variable resistance element.
Figure 5:
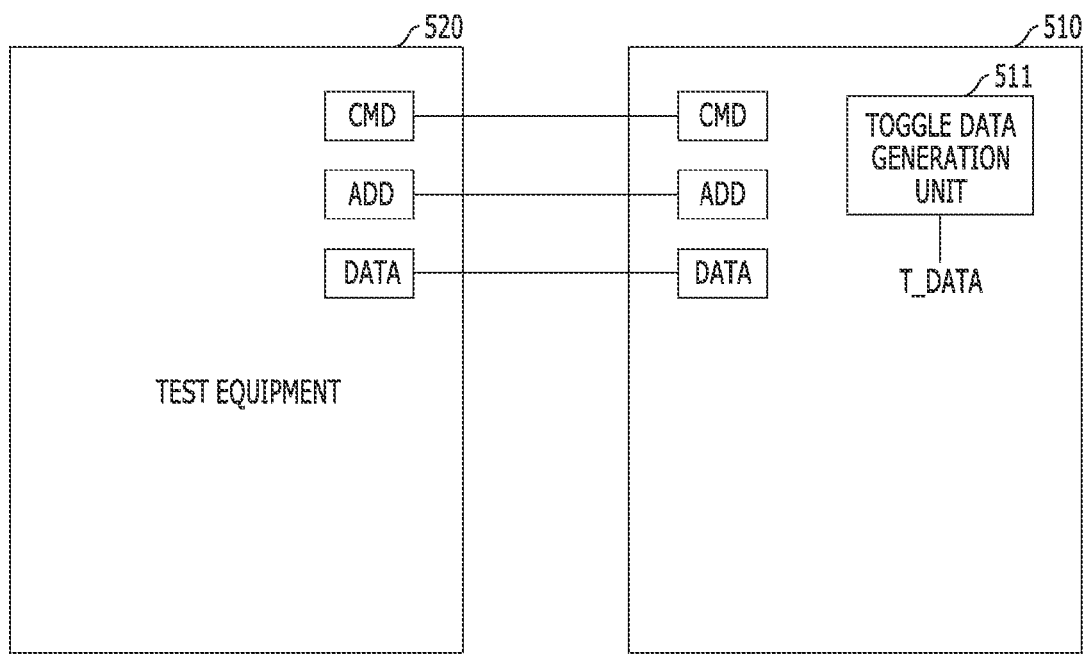
FIG. 5 is an example of a configuration diagram of a memory circuit or device operating with a test device.
Figure 6:
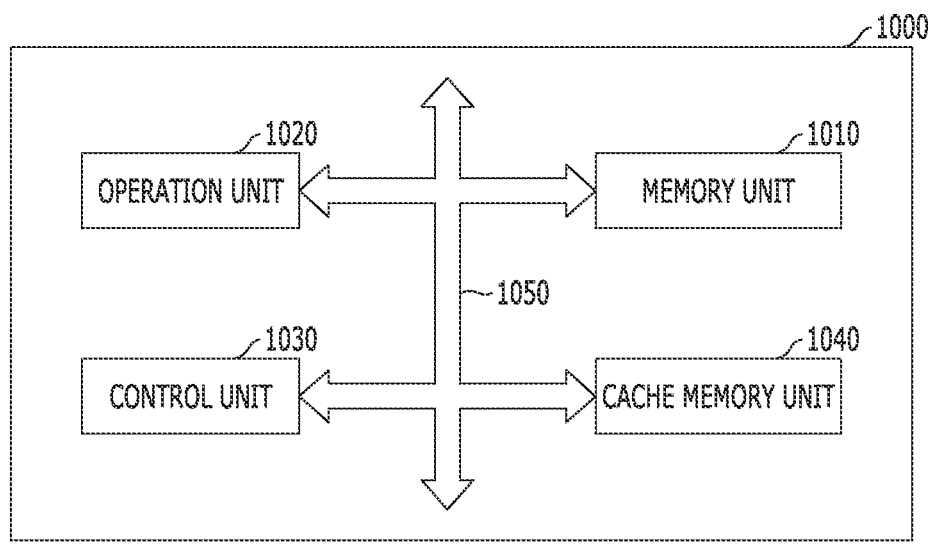
FIG. 6 shows an example of a configuration diagram of a microprocessor implementing memory circuitry based on the disclosed technology.
Figure 7:
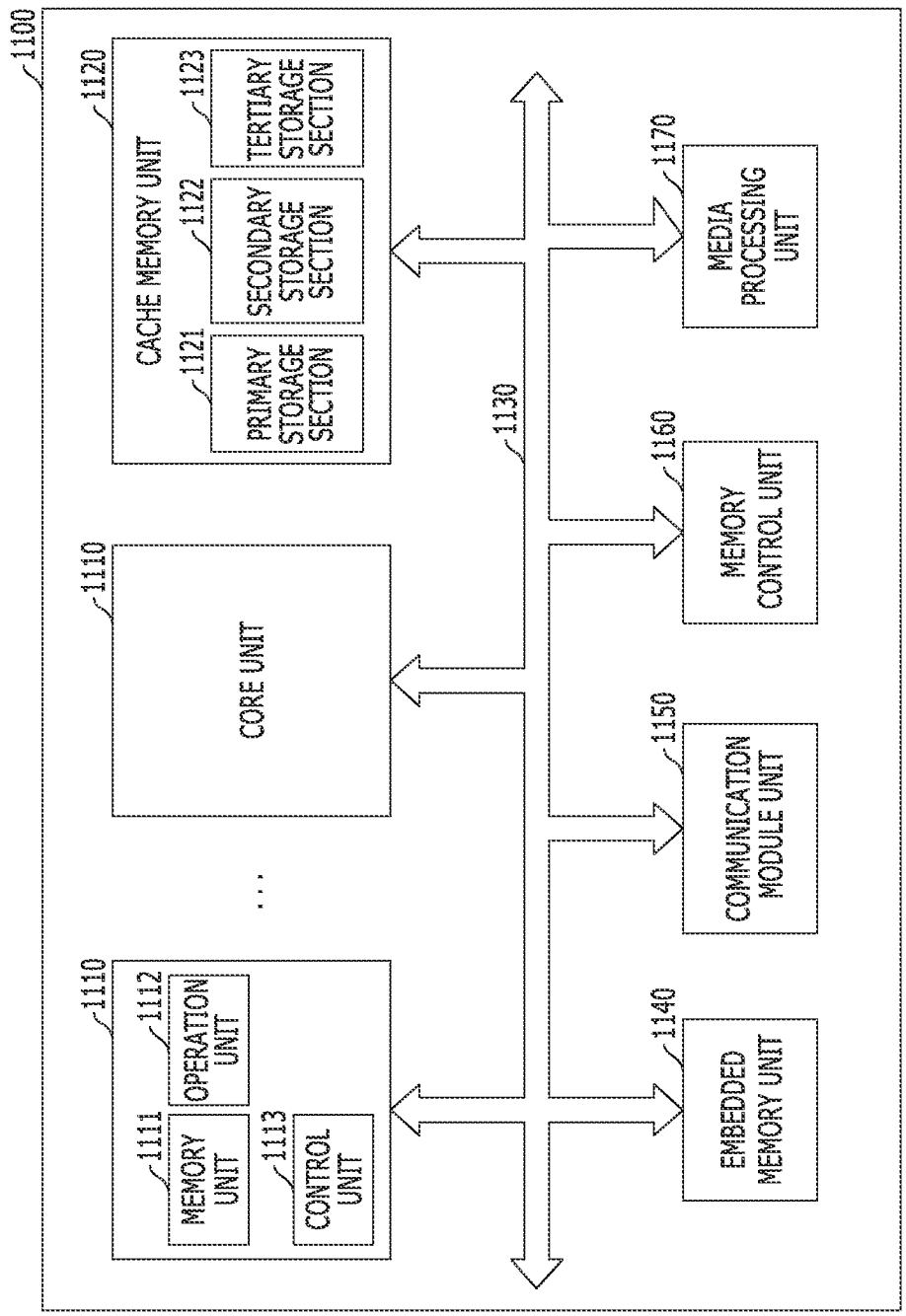
FIG. 7 shows an example of a configuration diagram of a processor implementing memory circuitry based on the disclosed technology.
Figure 8:
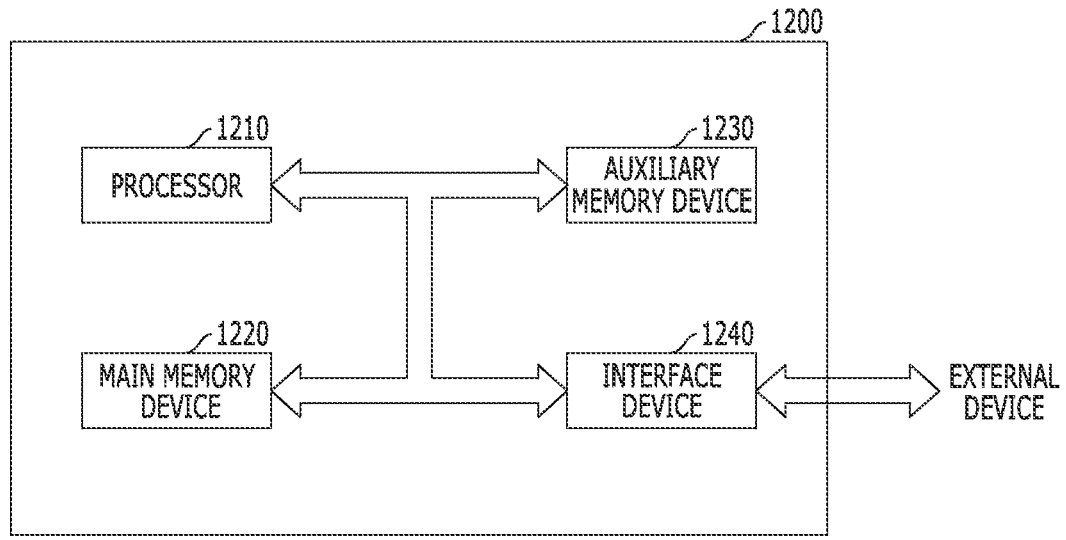
FIG. 8 shows an example of a configuration diagram of a system implementing memory circuitry based on the disclosed technology.

FIGS. 3-5 show examples of memory circuits (or electronic device) including variable resistance elements as described above and, in addition, built-in testing circuit elements for implementing the disclosed technology to reduce test cost and time.

FIG. 3 is an example of a configuration diagram of a memory circuit or device including a variable resistor.

Referring to FIG. 3, a semiconductor device includes a variable resistance element R configured to be changed in its resistance value in response to current flowing through both ends thereof, a toggle data generation unit 310 configured to generate toggle data T_DATA, a data transfer line DATA_LINE configured to transfer data inputted from an outside, and a driving unit 320 configured to provide a current flowing though the variable resistance element R. The semiconductor device operates in two different modes including a first mode and a second mode to direct one of two different data inputs into the driving unit 320. In the first mode, the toggle data T_DATA having a logic value toggling with a predetermined cycle is supplied to the driving unit 320 to test the reliability of the variable resistance element R. In the second mode, the data transfer line DATA_LINE is supplied to the driving unit 320 instead of toggle data T_DATA. When the toggle data T_DATA is inputted, the current flowing through the variable resistance element R changes its direction with the predetermined cycle for conducting the reliability test. In the second mode where the data transfer line DATA_LINE is inputted into the driving unit 320, the current flows through the variable resistance element R in a direction determined in response to the value of data from the data transfer line DATA_LINE.

The semiconductor device further includes a select transistor ST which is connected with the variable resistance element R to allow current to flow through the resistance variable element R in the case where the resistance value of the resistance variable element R is to be changed. The select transistor ST is turned on or turned off based on a select signal SS. If the select signal SS is activated, the select transistor ST is turned on, thereby allowing current to flow through the variable resistance element R. The semiconductor device further includes a comparison unit 330, a current source IS and a reference resistance element RE. The comparison unit 330, the current source IS and the reference resistance element RE operate to discriminate the resistance value of the variable resistance element R in the second mode as will be discussed later in detail. The resistance value of the reference resistance element RE may be between the low resistance value and the high resistance value of the variable resistance element R.

The operations of the semiconductor device will be described with reference to FIG. 3.

The variable resistance element R has two different states. The variable resistance element R has a first resistance value in the first state, and the variable resistance element R has a second resistance value greater than the first resistance value in the second state. The first state and the second state may correspond to the low resistance state and the high resistance state, respectively. A voltage can be applied to both ends of the variable resistance element R to cause a predetermined current to flow through the variable resistance element R variable resistance to switch the state of the variable resistance element R. The variable resistance element R is in the first state when first data is stored therein and in the second state when second data is stored therein. The first data and the second data may be defined as low data and high data, respectively, or the first data and the second data may be defined as high data and low data, respectively The toggle data generation unit 310 generates the toggle data T_DATA having logic value toggling with the predetermined cycle when the semiconductor device operates in the first mode to test its reliability. The toggle data generation unit 310 does not generate the toggle data T_DATA. The toggle data T_DATA generated in the first mode for performing the reliability test toggles between the first data and the second data when activated, and is retained as the value of one of the first data and the second data when deactivated. The toggling cycle with which the logic value of the toggle data T_DATA toggles may be controlled.

The toggle data generation unit 310 generates the toggle data T_DATA in response to a mode signal MOD which is activated when the semiconductor device operates in the first mode, cycle select information SEL<0:A> and a data clock D_CLK which has a basic cycle. The toggle data generation unit 310 generates the toggle data T_DATA which toggles with the cycle determined by the cycle select information SEL<0:A>, in the case where the mode signal MOD is activated. And the toggle data T_DATA is deactivated, in the case where the mode signal MOD is deactivated.

In the case where the mode signal MOD is activated, the toggle data generation unit 310 receives the data clock D_CLK and generates the toggle data T_DATA. In one implementation, the toggle data generation unit 310 may generate the toggle data T_DATA by dividing the data clock D_CLK by two. In other implementations, the toggle data generation unit 310 may the toggle data T_DATA by dividing the data clock D_CLK by four. Various configurations can be made on how to divide the data clock D_CLK. Division ratio of the data clock D_CLK is determined based on cycle select information SEL<0:A>.

In response to receiving the toggle data T_DATA from the toggle data generation unit 310 or the non-toggling data from the DATA_LINE, the driving unit 320 applies a predetermined voltage to both ends of the variable resistance element R. Thus, a predetermined current is directed to flow through the variable resistance element R. When the semiconductor device operates in the first mode, the driving unit 320 applies, in response to the toggle data T_DATA which toggles with the predetermined cycle (hereinafter, referred to as a toggle cycle), a voltage to both ends of the resistance variable element R. This applied voltage is changed in its direction with the same cycle as the toggle cycle and this change in the applied voltage causes the current flowing through the variable resistance element R to change the current direction with the toggle cycle. When the semiconductor device operates in the second mode, the driving unit 320 connects a voltage to both ends of the variable resistance element R in the direction that is determined in response to the data of the data transfer line DATA_LINE to cause a current flowing through the variable resistance element R based on the non-toggling data from the data transfer line DATA_LINE.

In the case where the mode signal MOD is activated (that is, in the case of the first mode), the current flows through the variable resistance element R in different directions depending on the value of toggling data at the driving unit 320. For example, current flows through the variable resistance element R in a first direction D1 when the toggle data T_DATA is the first data and the current flows through the variable resistance element R in a second direction D2 when the toggle data T_DATA is the second data. In the case where the mode signal MOD is deactivated (that is, in the case of the second mode), the current flows in different directions depending on the value of non-toggling data at the driving unit 320. For example, the current flows through the variable resistance element R in the first direction D1 when the data of the data transfer line DATA_LINE is the first data and the current flows through the variable resistance element R in the second direction D2 when the data of the data transfer line DATA_LINE is the second data. The data of the data transfer line DATA_LINE may be inputted from an outside data source.

Hereinafter, the operations of the semiconductor device will be separately explained for the two different modes.

(1) Operations of the Semiconductor Device in the First Mode

The first mode of the semiconductor device may be an operation mode for performing a stress test for evaluating the reliability of the variable resistance element R. In the first mode, a stress is applied to the variable resistance element R such that current flowing through the variable resistance element R changes its direction with the predetermined cycle. When the semiconductor device is in the first mode, the mode signal MOD is activated. When the mode signal MOD is activated, the toggle data generation unit 310 supplies the toggle data T_DATA which toggles with the predetermined cycle to the driving unit 320. The predetermined cycle is determined based on the cycle select information SEL<0:A>. When the mode signal MOD is activated, if the select signal SS is activated, the select transistor ST is turned on and current flows through the variable resistance element R. Current flowing through the variable resistance element changes its direction with the predetermined cycle.

(2) Operations of the Semiconductor Device in the Second Mode

The second mode of the semiconductor device may be an operation mode for performing writing or reading operation using the variable resistance element R. In the second mode, the semiconductor device changes the resistance value of the variable resistance element R according to data to be stored in the variable resistance element R or discriminates the resistance value of the variable resistance element R to discriminate the data stored in the variable resistance element R. In detail, if the semiconductor device is set to the second mode, the mode signal MOD is deactivated. After the mode signal MOD is deactivated, if the select signal SS is activated, the select transistor ST is turned on and the current flows through the variable resistance element R.

The semiconductor device performs a writing operation when a command WT for storing data in the variable resistance element R is inputted. In this case, data to be stored in the variable resistance element R is inputted through the data transfer line DATA_LINE. The toggle data T_DATA is deactivated. The driving unit 320 flows the current through the variable resistance element R in the direction determined based on the data of the data transfer line DATA_LINE. According to the direction of the current flowing through the variable resistance element R, the resistance value of the variable resistance element R is changed to store a low logic value or high logic value.

The semiconductor device performs a read operation when a command RD for discriminating the data stored in the variable resistance element R is inputted. In this case, the driving unit 320 directs a predetermined current through the variable resistance element R in the first direction D1, and the same current flows through the current source IS and through the reference resistance element RE. The comparison unit 330 compares the voltage applied at the variable resistance element R with the voltage applied at the reference resistance element RE and outputs the comparison result to an output node OUT. Since the magnitude of current flowing through the variable resistance element R is the same as the magnitude of current flowing through the reference resistance element RE, the comparison result of the comparison unit 330 depends on the magnitudes of the resistance values of the variable resistance element R and the reference resistance element RE.

In order to evaluate reliability of the variable resistance element R by applying a stress to the resistance variable element R in the first mode, the semiconductor device for which the stress test is completed in the first mode operates in the second mode to store data in the variable resistance element R using a command WT and discriminates the data stored in the variable resistance element R using a command RD. If the variable resistance element R has the same value before and after the stress test, it is determined that the variable resistance element R has passed the stress test and has sufficient reliability. If the variable resistance element R has different values before and after performing the stress test, it is determined that the variable resistance element R has not passed the stress test and does not have sufficient reliability.

As discussed above, the semiconductor device internally generates toggle data that is used for the stress test. Accordingly, toggle data does not need to be separately provided from an outside such as a test device, and a pad used to be equipped to couple to a test device for receiving the toggle data from the outside can be omitted.

FIG. 4 is an example of a configuration diagram of a memory circuit or device including a variable resistance element R.

Referring to FIG. 4, a semiconductor device includes a plurality of storage cells SC including variable resistance elements R, a toggle data generation unit 410, and an access control unit 420. The resistance values of the variable resistance elements R are determined according to the values of the data stored therein. The semiconductor device operates in two different modes including a first mode and a second mode. In the first mode, the toggle data generation unit 410 generates toggle data T_DATA having logic value toggling with a predetermined cycle. In the second mode, the access control unit 420 receives from a data transfer line DATA_LINE non-toggling data that is provided from outsiders. When the toggle data T_DATA is supplied in the first mode, the access control unit 420 provides current flowing through a variable resistance element R selected among the plurality of variable resistance elements R, whose direction changes with the predetermined cycle. When the non-toggling data from the data transfer line DATA_LINE is supplied, the access control unit 420 provides current flowing through a variable resistance element R selected among the plurality of variable resistance elements R, whose direction is determined based on the value of data from the data transfer line DATA_LINE.

The semiconductor device further includes a command pad CMD, an address pad ADD, a data pad DATA, a command decoder 430, a mode setting unit 440, and a comparison unit 450. The common pad CMD inputs at least one command signal. The address pad ADD inputs at least one address signal. The data pad DATA inputs and outputs data. The command decoder 430 generates internal commands WT, RD or SET based on the at least one command signal inputted through the at least one command pad CMD. The mode setting unit 440 sets the semiconductor device to the first mode or the second mode in response to a setting command SET. The comparison unit 450 compares the voltage applied at the variable resistance element R included in a particular storage cell SC and the voltage applied at the reference resistance element RE.

The plurality of variable resistance elements R are connected with the corresponding select transistors ST. The select transistors ST are connected with the corresponding word lines among a plurality of word lines WL0 to WLN. Each variable resistance element R and its corresponding select transistor ST form a storage cell SC. One ends of storage cells SC are connected to a first line L1 and the other ends of storage cells SC are connected to a second line L2.

In operating the semiconductor device of FIG. 4, if a word line is selected among the plurality of word lines WL0 to WLN, each storage cell SC connected to the word line is selected. A read or write (read/write) operation or a stress test may be performed for the storage cell SC selected among the plurality of storage cells SC.

Data is inputted and outputted through the data pad DATA to and from the semiconductor device. The data inputted and outputted through the data pad DATA may be transferred through a data input/output line IO_LINE.

The command decoder 430 may decode a command signal inputted through the command pad CMD and generate the internal commands WT, RD and SET. The internal commands WT, RD and SET may include a write command WT for writing data in the selected storage cell SC, a read command RD for reading data from the selected storage cell SC, and the setting command SET for setting the operation mode of the semiconductor device.

In response to receiving the setting command SET and the address signal, the mode setting unit 440 sets the semiconductor device to operate in either first mode or the second mode. As discussed above, the first mode is an operation mode for performing a stress test and the second mode is an operation mode for performing a read/write operation. The mode setting unit 440 activates the mode signal MOD when the semiconductor device is set to the first mode, and deactivates the mode signal MOD when the semiconductor device is set to the second mode.

The toggle data generation unit 410 operates in the same manner as the toggle data generation unit 310 of FIG. 3. The toggle data generation unit 410 generates the toggle data T_DATA when the semiconductor device is set to the first mode.

The access control unit 420 are coupled to both ends of the plurality of storage cells and drives the selected storage cell SC with a predetermined voltage such that predetermined current flows through the variable resistance element R. In the first mode of the semiconductor device, if the write command WT is activated, the toggle data T_DATA having data toggling with a cycle is generated and provided to the access control unit 420. In this case, the access control unit 420 applies a forward voltage or a reverse voltage with the same cycle as the toggle cycle of the toggle data T_DATA to both ends of the selected storage cell SC. Thus, current of which direction is changed with the toggle cycle flows in the selected storage cell SC.

In the second mode of the semiconductor device, the access control unit 420 performs read or write operation depending on the type of the command. If the write command WT is activated in the second mode, data is provided from the data transfer line DATA_LINE to the access control unit 420 and the access control unit 420 applies a voltage to both ends of the selected storage cell SC. Thus, predetermined current flows in the storage cell SC in the direction determined based on the received data of the data transfer line DATA_LINE when the write command WT is activated to write data in the selected storage cell SC. If the read command RD is activated in the second mode, the access control unit 420 applies a voltage to both ends of a selected storage cell SC. and thus, a predetermined current flows to the selected storage cell SC to read data from the selected storage cell SC.

In the case of the first mode that the mode signal MOD is activated, if the toggle data T_DATA has a logic value of the first data, current flows through the selected storage cell SC in a first direction D1 and if the toggle data T_DATA has a logic value of the second data, current flows through the selected storage cell SC in a second direction D2. In the case of the second mode that the mode signal MOD is deactivated, when the write command WT is activated, D1 if the non-toggling data has a logic value of the first data, current flows in the selected storage cell SC in the first direction and if the non-toggling data has a logic value of the second data, current flows through the selected storage cell SC in the second direction D2. The data of the data transfer line DATA_LINE may be the data transferred from a data input/output line among data input/output lines IO_LINE.

The comparison unit 450 operates to perform the write operation when the semiconductor device is set to the first mode. The current source IS delivers predetermined current to the reference resistance element RE. The amount of the current flowing through the reference resistance element RE may be the same as the amount of the current flowing through the selected storage cell SC. The reference resistance element RE provides a standard value for discriminating whether the variable resistance element R included in the selected storage cell SC has a first resistance value or a second resistance value. The reference resistance element RE may have a resistance value greater than the first resistance value of the variable resistance element R and smaller than the second resistance value of the variable resistance element R.

The comparison unit 450 operates to perform the read operation when the semiconductor device is set to the second mode. The comparison unit 450 compares the voltage applied at the variable resistance element R with the voltage applied at reference resistance element RE and outputs the comparison result to an output node OUT. Since the amount of the current flowing through the variable resistance element R is the same as that of the current flowing through the reference resistance element RE, the comparison result of the comparison unit 450 depends on the magnitudes of the resistance values of the variable resistance element R and the reference resistance element RE.

Hereinafter, the operations of the semiconductor device will be separately explained for the two different modes.

(1) Operations of the Semiconductor Device in the First Mode

When a combination of at least one command signal corresponding to the setting command SET and a combination of at least one address signal corresponding to setting of the first mode are inputted, the semiconductor device is set to the first mode and the mode signal MOD is activated. If the mode signal MOD is activated, the toggle data generation unit 410 generates the toggle data T_DATA toggling with the cycle determined by the cycle select information SEL<0:A>. The cycle select information SEL<0:A> may be stored in the semiconductor device or provided from an outside of the semiconductor device.

If a word line among the plurality of word lines WL0 to WLN is activated by the address signal ADD, current may flow through the storage cell SC connected to the activated word line. The toggle data T_DATA is provided from the toggle data generation unit 410 to the access control unit 420 and current of which direction changes with the predetermined cycle flows through the selected storage cell SC. A stress test is performed by providing the toggling data T_DATA to the selected storage cell SC for a predetermined period. After a predetermined period expires and a stress test is done for the selected storage cell SC, another storage cell SC is selected and a stress test is performed for the newly selected storage cell SC. The semiconductor device may repeat performing a stress test for all the storage cells SC included in the semiconductor device.

(2) Operations of the Semiconductor Device in the Second Mode

When a combination of at least one command signal corresponding to the setting command SET and a combination of at least one address signal corresponding to setting of the second mode are inputted, the semiconductor device is set to the second mode and the mode signal MOD is deactivated. If the mode signal MOD is deactivated, the toggle data T_DATA is deactivated.

If a combination of at least one command signal corresponding to the write command WT, at least one address signal ADD and data DATA are inputted, a word line corresponding to the inputted at least one address signal ADD is activated among the plurality of word lines WL0 to WLN, and current may be flowed through the selected storage cell SC corresponding to the activated word line. The access control unit 420 flows predetermined current through the selected storage cell SC in the direction determined by the value of the data transferred through the data transfer line DATA_LINE, in response to the write command WT. The resistance value of the resistance variable element R included in the selected storage cell SC is switched to a value corresponding to the current flowing through the resistance variable element R. In other words, the data of the data transfer line DATA_LINE is written in the selected storage cell SC.

If a combination of at least one command signal corresponding to the read command RD and at least one address signal ADD are inputted, a word line corresponding to the inputted at least one address signal ADD is activated among the plurality of word lines WL0 to WLN, and current may be flowed through the selected storage cell SC corresponding to the activated word line. The access control unit 420 flows current in a predetermined direction in response to the read command RD. The current source IS flows current through the reference resistance element RE. The comparison unit 450 outputs a result of comparing the voltage applied to both ends of the resistance variable element R of the selected storage cell SC and the voltage applied to both ends of the reference resistance element RE, to the output node OUT. The result outputted to the output node OUT may be transferred to an outside of the semiconductor device through the data transfer line DATA_LINE.

As discussed above, the semiconductor device operates in the first mode until the stress test is repeatedly performed for variable resistance elements R included in the plurality of storage cells SC. After completing the stress test for variable resistance elements R included in the plurality of storage cells SC, the semiconductor device operates in the second mode by storing data in variable resistance elements R and discriminating data stored in variable resistance elements R. When the resistance value of a variable resistance element R is not the same before and after the stress test, it is determined that the variable resistance element R has failed in the test. Through the above-described procedure, it is possible to evaluate the reliability of a variable resistance element and detect a variable resistance element R having poor reliability.

The semiconductor device internally generates toggling data that is used for a stress test. Accordingly, toggling data does not need be provided through a data pad from an outside test device. That is to say, the number of pads needed to perform the stress test may be decreased. Therefore, test device may test a number of semiconductor devices simultaneously and a time and a cost required for a stress test may be reduced.

FIG. 5 is an example of a configuration diagram of a electronic device including a memory circuit or device and test device.

Referring to FIG. 5, the semiconductor device 510 includes at least one data pad DATA, a command pad CMD, an address pad ADD, and a toggle data generation unit 511. Although not shown, the semiconductor device 510 includes a plurality of variable resistance elements R of which resistance values are determined according to the values of the data stored therein. The test device 520 includes pads for communicating with the semiconductor device 510. In FIG. 5, the test device 520 includes a command signal pad CMD, an address signal pad ADD, and a data pad DATA. While it is illustrated in FIG. 5 that a semiconductor device 510 is connected with the test device 520, the test device 520 may include a number of pads CMD, ADD and DATA and be connected with a number of semiconductor devices 510 at one time.

The test device 520 provides a command signal to allow the semiconductor device 510 to operate in either the first mode or the second mode through a command pad CMD, and provides data to be written in the semiconductor device 510 through a data pad DATA. Further, when the semiconductor device 510 operates in the second mode, the data outputted from the semiconductor device 510 is received by the test equipment 520 though the data pad DATA.

The configurations and operations of the semiconductor device 510 shown in FIG. 5 are the same as those of the semiconductor device shown in FIG. 4.

In order to perform a stress test, the test device 520 inputs a command signal with an address signal such that the semiconductor device 510 is set to the first mode. If the semiconductor device 510 is set to the first mode, the toggle data T_DATA is generated. Thereafter, the test device 520 sequentially inputs a combination of at least one command signal corresponding to a write command and a combination of at least one address signal with a predetermined interval. In order to complete the stress test for all the storage cells SC, the test device 520 provides each address signals corresponding to the word line WL0 to the word line WLN with a predetermined interval. In this case, current of which direction changes with the predetermined cycle flows through each variable resistance element R for a predetermined period. If the stress test is completely performed for all the variable resistance elements R included in the semiconductor device 510, the test device 520 inputs at least one command signal and at least one address signal to allow the semiconductor device 510 to exit the first mode.

After the stress test is completed in the first mode, the test device 520 performs operations for writing predetermined data in the plurality of resistance variable elements R and reading data from the plurality of resistance variable elements R.

In order to perform the write operation, a write command WT, an address signal and data is inputted and the test device 520 writes predetermined test data in variable resistance elements R. Next, in order to perform the read operation, a read command RD and an address signal is inputted and the test device 520 receives the data outputted from the semiconductor device 510 and detects a variable resistance element R with poor reliability.

When performing a stress test for semiconductor devices, the test device 520 does not need to allocate pads to each semiconductor device 510. In other words, since the number of pads necessary for the stress test is decreased and an increased number of semiconductor devices 510 can be tested using the same number of pads. Accordingly, a time and a cost required for a the stress test can be saved.

The above and other memory circuits or semiconductor devices based on the disclosed technology can be used in a range of devices or systems. FIGS. 6-10 provide some examples of devices or systems that can implement the memory circuits disclosed herein.

Figure 9:
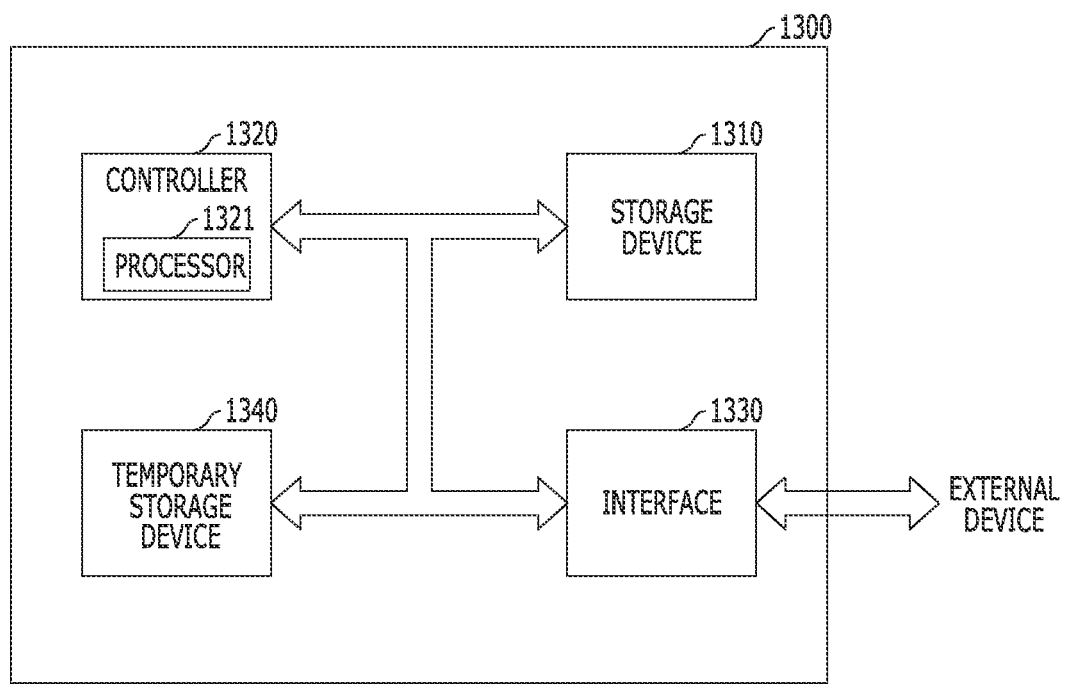
FIG. 9 shows an example of a configuration diagram of a data storage system implementing memory circuitry based on the disclosed technology.

FIG. 9 shows an example of a configuration diagram of a microprocessor based on another implementation of the disclosed technology.

Referring to FIG. 9, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing of the operations are stored.

The memory unit 1010 may include one or more of the above-described semiconductor devices in accordance with the implementations. For example, the memory unit 1010 implementation may include a variable resistance element configured to be changed in a resistance value thereof in response to current flowing through both ends thereof, a toggle data generation unit configured to generate toggle data of which logic value toggles with a predetermined cycle, in a first mode, a data transfer line configured to transfer data inputted from an outside, and a driving unit configured to flow current which is changed in its direction with the predetermined cycle, through the variable resistance element in response to the toggle data in the first mode, and flow current through the variable resistance element in a direction determined in response to the data of the data transfer line, in a second mode. Through this, the test cost and the time of memory unit 1010 may be reduced. Consequently, the manufacture cost and time of the microprocessor 1000 may be reduced.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 10:
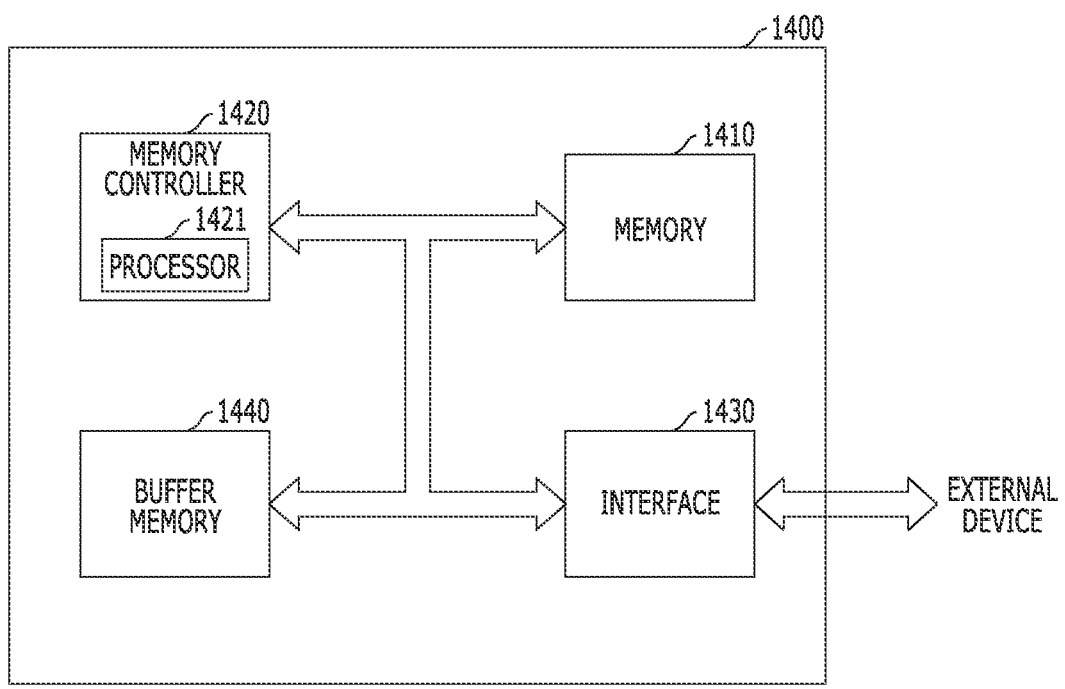
FIG. 10 shows an example of a configuration diagram of a memory system implementing memory circuitry based on the disclosed technology.

FIG. 10 is a configuration diagram of a processor based on another implementation of the disclosed technology.

Referring to FIG. 10, the processor may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit 1121, a secondary storage unit 1122 and a tertiary storage unit 1123. In general, the cache memory unit 1120 includes the primary and secondary storage units 1121 and 1122, and may include the tertiary storage unit 1123 in the case where high storage capacity is required. As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest. At least one storage unit of the primary storage unit 1121, the secondary storage unit 1122 and the tertiary storage unit 1123 of the cache memory unit 1120 may include one or more of the above-described semiconductor devices in accordance with the implementations. For example, the cache memory unit 1120 implementation may include a variable resistance element configured to be changed in a resistance value thereof in response to current flowing through both ends thereof, a toggle data generation unit configured to generate toggle data of which logic value toggles with a predetermined cycle, in a first mode, a data transfer line configured to transfer data inputted from an outside, and a driving unit configured to flow current which is changed in its direction with the predetermined cycle, through the variable resistance element in response to the toggle data in the first mode, and flow current through the variable resistance element in a direction determined in response to the data of the data transfer line, in a second mode. Through this, the test cost and the time of the cache memory unit 1120 may be reduced. Consequently, the manufacture cost and time of the processor 1100 may be reduced.

Although it was shown in FIG. 10 that all the primary, secondary and tertiary storage units 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110. The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger than the processing speeds of the secondary and tertiary storage unit 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130. The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

FIG. 11 is a configuration diagram of a system based on another implementation of the disclosed technology.

Referring to FIG. 11, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 implementation may include a variable resistance element configured to be changed in a resistance value thereof in response to current flowing through both ends thereof, a toggle data generation unit configured to generate toggle data of which logic value toggles with a predetermined cycle, in a first mode, a data transfer line configured to transfer data inputted from an outside, and a driving unit configured to flow current which is changed in its direction with the predetermined cycle, through the variable resistance element in response to the toggle data in the first mode, and flow current through the variable resistance element in a direction determined in response to the data of the data transfer line, in a second mode. Through this, the test cost and the time of the main memory device 1220 may be reduced. Consequently, the manufacture cost and time of the system 1200 may be reduced.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 implementation may include a variable resistance element configured to be changed in a resistance value thereof in response to current flowing through both ends thereof, a toggle data generation unit configured to generate toggle data of which logic value toggles with a predetermined cycle, in a first mode, a data transfer line configured to transfer data inputted from an outside, and a driving unit configured to flow current which is changed in its direction with the predetermined cycle, through the variable resistance element in response to the toggle data in the first mode, and flow current through the variable resistance element in a direction determined in response to the data of the data transfer line, in a second mode. Through this, the test cost and the time of the auxiliary memory device 1230 may be reduced. Consequently, the manufacture cost and time of the system 1200 may be reduced.

Also, the auxiliary memory device 1230 may further include a data storage system (see the reference numeral 1300 of FIG. 12) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 12) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device

1240 may be a keypad, a keyboard, a mouse, a speaker, a mike, a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

FIG. 12 is a configuration diagram of a data storage system based on another implementation of the disclosed technology.

Referring to FIG. 12, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other. The temporary storage device 1340 can store data temporarily implementation for efficiently transferring data between the interface 1330 and the storage device 1310 according to diversifications and high performance of an interface with an external device, a controller and a system. For example, the temporary storage device 1340 implementation for temporarily storing data may include a variable resistance element configured to be changed in a resistance value thereof in response to current flowing through both ends thereof, a toggle data generation unit configured to generate toggle data of which logic value toggles with a predetermined cycle, in a first mode, a data transfer line configured to transfer data inputted from an outside, and a driving unit configured to flow current which is changed in its direction with the predetermined cycle, through the variable resistance element in response to the toggle data in the first mode, and flow current through the variable resistance element in a direction determined in response to the data of the data transfer line, in a second mode. Through this, the test cost and the time of the temporary storage device 1340 may be reduced. Consequently, the manufacture cost and time of the data storage system 1300 may be reduced.

FIG. 13 is a configuration diagram of a memory system based on another implementation of the disclosed technology.

Referring to FIG. 13, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 implementation may include a variable resistance element configured to be changed in a resistance value thereof in response to current flowing through both ends thereof, a toggle data generation unit configured to generate toggle data of which logic value toggles with a predetermined cycle, in a first mode, a data transfer line configured to transfer data inputted from an outside, and a driving unit configured to flow current which is changed in its direction with the predetermined cycle, through the variable resistance element in response to the toggle data in the first mode, and flow current through the variable resistance element in a direction determined in response to the data of the data transfer line, in a second mode. Through this, the test cost and the time of the memory 1410 may be reduced. Consequently, the manufacture cost and time of the memory system 1400 may be reduced.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 implementation may include a variable resistance element configured to be changed in a resistance value thereof in response to current flowing through both ends thereof, a toggle data generation unit configured to generate toggle data of which logic value toggles with a predetermined cycle, in a first mode, a data transfer line configured to transfer data inputted from an outside, and a driving unit configured to flow current which is changed in its direction with the predetermined cycle, through the variable resistance element in response to the toggle data in the first mode, and flow current through the variable resistance element in a direction determined in response to the data of the data transfer line, in a second mode. Through this, the test cost and the time of the buffer memory 1440 may be reduced. Consequently, the manufacture cost and time of the memory system 1400 may be reduced.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 9-13 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular implementations of particular inventions. Certain features that are described in this patent document in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the implementations described in this patent document should not be understood as requiring such separation in all implementations.

Only a few implementations and examples are described. Other implementations, enhancements and variations can be made based on what is described and illustrated.

What is claimed is:

1. A method for operating a test device to test one or more semiconductor devices, comprising:
    connecting one or more semiconductor devices under test to a test device, wherein each semiconductor device includes one data pad, a plurality of variable resistance elements which are determined in resistance values thereof according to values of data stored therein, and a toggle data generation unit which generates toggle data with a logic value toggling with a predetermined cycle in a first mode, and configured to flow a current which is changed in its direction with the predetermined cycle, through a variable resistance element selected among the plurality of variable resistance elements in response to the toggle data in the first mode and flow another current through a variable resistance element selected among the plurality of variable resistance elements in a direction determined in response to data inputted through the one data pad in a second mode;
    operating the test device to input a command signal to set a semiconductor device under test to operate in the first mode; and
    operating the test device to input another command signal to set and the semiconductor device under test to operate in the second mode to write input data from the one data pad in the semiconductor device, or to read input data from the semiconductor device.

2. The method according to claim 1, wherein each of the variable resistance elements has a first resistance value in the case where first data is stored therein and a second resistance value larger than the first resistance value in the case where second data is stored therein.

3. The method according to claim 1, comprising:
- in the first mode, operating the semiconductor device to direct a current in a first direction through the variable resistance element when the toggle data is first data and direct a current in a second direction through the variable resistance element when the toggle data is second data, and
- in the second mode and in a write operation, operating the semiconductor device to direct a write current in the first direction through the variable resistance element when the data of a data transfer line is the first data and to direct a write current in the second direction through the variable resistance element when the data of the data transfer line is the second data.

4. The method according to claim 1, comprising:
- operating the test device to operate the semiconductor device under test in the second mode after completing an operation of the semiconductor device in the first mode;
- while in the second mode, using the one data pad to input data to be written in the plurality of variable resistance elements of the semiconductor device under test and subsequently reading data of the plurality of variable resistance elements through the one data pad; and
- detecting whether there is a failed variable resistance element among the plurality of variable resistance elements by using the read data.

5. The method according to claim 1, further comprising:
- operating the test device to simultaneously test two or more semiconductor devices.

* * * * *